TWO-VALLEY SEMICONDUCTOR PULSE GENERATOR AND RELATED CIRCUITS

Filed Nov. 26, 1968 3 Sheets-Sheet 1

INVENTOR
R. E. FISHER
BY
ATTORNEY

Dec. 15, 1970 R. E. FISHER 3,548,340

TWO-VALLEY SEMICONDUCTOR PULSE GENERATOR AND RELATED CIRCUITS

Filed Nov. 26, 1968 3 Sheets-Sheet 3

United States Patent Office 3,548,340

Patented Dec. 15, 1970

3,548,340

TWO-VALLEY SEMICONDUCTOR PULSE GENERATOR AND RELATED CIRCUITS

Reed E. Fisher, Parsippany, Troy Hills Township, Morris County, N.J., assignor to Bell Telephone Laboratories, Incorporated, Murray Hill and Berkeley Heights, N.J., a corporation of New York

Continuation-in-part of application Ser. No. 671,033, Sept. 27, 1967. This application Nov. 26, 1968, Ser. No. 779,064

Int. Cl. H03b *7/06*

U.S. Cl. 331—107 12 Claims

ABSTRACT OF THE DISCLOSURE

A pulse generator comprises a two-valley semiconductor diode connected in series with a bias source and the parallel combination of an inductor and a resistive load. The inductor inhibits triggering of the diode, thereby reducing the pulse repetition rate of power delivered to the load. The pulse rate can be varied by varying the voltage of the bias source. In other embodiments, diode triggering is inhibited by reflections from the end of a suitably terminated transmission line.

CROSS REFERENCES TO RELATED APPLICATIONS

This is a continuation-in-part of my copending application, R. E. Fisher, Ser. No. 671,033, filed Sept. 27, 1967, and now abandoned and relates to "Two-Valley Semiconductor Pulse Generator and Related Circuits."

BACKGROUND OF THE INVENTION

For many applications, such as in new pulse code modulation systems, it would be desirable to provide pulse trains having higher repetition rates and higher power than those delivered by present pulse generators. Tunnel diode pulse oscillators are capable of generating pulse trains having very high repetition rates, but their output power is limited. Charge storage or snap diode pulse generators can deliver pulses of high power, but their speed is somewhat limited, and rather complex circuitry is required. Circuits known as Gunn oscillators or two-valley semiconductor oscillators are not generally suitable for systems under present development because their pulse repetition rate is normally higher than that desired for such applications.

The structure and operation of two-valley semiconductor devices are described in detail in a series of papers in the January 1966 issue of IEEE Transactions on Electron Devices, vol. ED–13. As set forth in these papers a negative resistance can be obtained from a bulk semiconductor wafer of a substantially homogeneous constituency having two energy band minima within the conduction band which are separated by only a small energy difference. By establishing a suitably high electric field across opposite ohmic contacts of the semiconductor wafer, oscillations can be induced which result from the formation of discrete regions of high electric field intensity and corresponding space-charge accumulation, called domains, that travel from the negative to the positive contact at approximately the carrier drift velocity. As these domains are successively extinguished at the positive contact, pulses are generated in the external circuit; and as such the circuit may be used as a pulse generator.

The frequency at which pulses are generated is determined by the length of the semiconductor wafer and the semiconductor carrier concentration. The extent to which these parameters can be varied is limited and, as a practical matter, the pulse repetition rate of such devices is on the order of $10^9$ to $10^{12}$ bits per second. Moreover, conventional Gunn-effect pulse generators are not tunable; a given device will operate at substantially only a single frequency.

SUMMARY OF THE INVENTION

I have found that by connecting an inductor in parallel with the load of a two-valley semiconductor oscillator circuit, the pulse repetition rate can be reduced by an order of magnitude or more, thus giving a pulse generator which is practical and which delivers an output that is suitable for those applications set forth above. The inductor stores energy in the oscillator circuit and applies it to the two-valley diode such as to inhibit the nucleation of electric field domains for a prescribed time determined by the time constant of the circuit. Hence, the period between successive pulses is substantially increased and the pulse repetition rate is reduced. Moreover, the inductor controls the energy impressed across the load such as to sharpen the output voltage pulses and thereby increase the output voltage. Finally, the device is voltage tunable; by varying the bias voltage one can vary the output pulse repetition rate.

For the pulse generator to delivery regularly recurring pulses as described above, the bias source should supply a higher voltage than the threshold required for triggering electric field domains in the diode. As will be appreciated later, the pulse repetition rate of the circuit may then be varied by varying the bias voltage within a range that exceeds the threshold for domain nucleation. Alternatively, the circuit may be used as a pulse regenerator by using a bias source having a voltage below the threshold value and by using input pulses which bias the diode beyond the threshold value in the manner described generally in the copending application of M. Uenohara, Ser. No. 542,170, filed Apr. 12, 1966 and now abandoned and assigned to the Bell Telephone Laboratories, Incorporated.

In another embodiment, a transmission line connected at one end to the diode and terminated at the other end by either a low impedance load or a short circuit is used to control domain nucleation and output pulse frequency by reflecting pulse energy back to the diode with a delay determined by the transmission line length. The low impedance termination reverses the polarity of the reflected pulse so that, when it reaches the diode, it lowers the diode voltage to suppress domain nucleation. Thereafter, reflection at both ends of the transmission line is repeated, and with a proper selection of line length, further domain nucleation can be suppressed until the reflected pulse becomes sufficiently attenuated through reflection losses that the D-C bias is again sufficient to trigger the diode. The cycle then repeats itself and, as will be seen later, a train of substantially square wave pulses may be produced across the load having a frequency that can be modulated by changing the bias voltage.

DRAWING DESCRIPTION

These and other objects, features, and advantages of the invention will be better understood from a consideration of the following detailed description taken in conjunction with the accompanying drawing in which.

DETAILED DESCRIPTION

Figure 1:
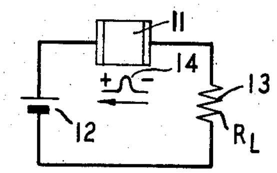
FIG. 1 PRIOR ART
FIG. 1 is a Gunn-effect oscillator or two-valley semiconductor oscillator of the prior art.

Referring now to FIG. 1, there is shown a conventional Gunn-effect oscillator comprising a two-valley semiconductor diode 11 connected in series with a bias source 12 and a load resistance 13. When the voltage across the diode, or conversely the current through the diode, exceeds a critical value, a high electric field domain is nucleated at the negative contact which travels rapidly toward the positive contact as indicated schematically at 14. When the domain reaches the positive contact, it is extinguished, along with the high voltage across the domain, and a current surge flows through the load resistance $R_L$, giving rise to a voltage pulse 15 shown by the graph of FIG. 2. If the bias voltage of the diode still exceeds the critical voltage, a new high field domain will be nucleated which will again travel toward the positive contact. The time taken for the domain to traverse the diode, or the domain transit time $\tau$, is given as $$\tau=\frac{l}{v_0} \qquad (1)$$

where $l$ is the length of the semiconductor wafer between contacts, and $v_0$ is the carrier drift velocity.

Figure 2:
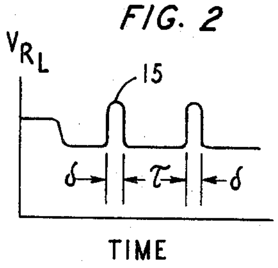
FIG. 2 is a graph of voltage across the load resistance versus time in the circuit of FIG. 1.

During time $\tau$, the voltage across the load resistance is low and steady as shown in FIG. 2, and after the domain reaches the positive contact, another pulse of width $\delta$ is generated. It is apparent from Equation 1 that the only way to control the repetition rate of the output is by controlling the wafer length or the carrier drift velocity which is a function of carrier concentration; as a practical matter, the circuit of FIG. 1 has a pulse repetition rate $l/\tau$ of from $10^9$ to $10^{12}$ bits per second. Moreover, there is no convenient way to vary the output pulse repetition rate of a given device.

Figure 3:
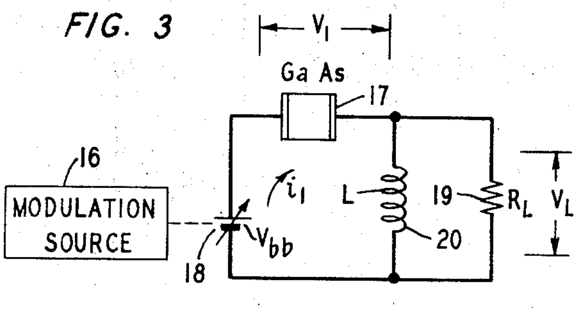
FIG. 3 is a schematic diagram of a pulse generator circuit in accordance with an illustrative embodiment of the present invention.

Referring to FIG. 3, there is shown a pulse generator in accordance with the present invention comprising a two-valley semiconductor device 17 connected in series with a bias source 18 and a load 19 of resistance $R_L$ which is connected in parallel with an inductor 20 of inductance L. The voltage source 18 generates a voltage above the threshold for domain nucleation, but the inductor inherently inhibits domain nucleation for a prescribed period of time after each domain is extinguished, and thereby substantially reduces the pulse repetition rate of the circuit.

Figure 4:
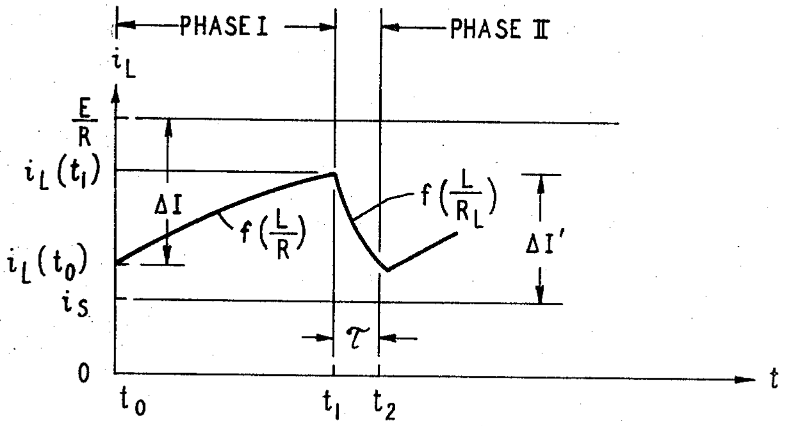
FIG. 4 is a graph of inductor current versus time in the circuit of FIG. 4.
Figure 5:
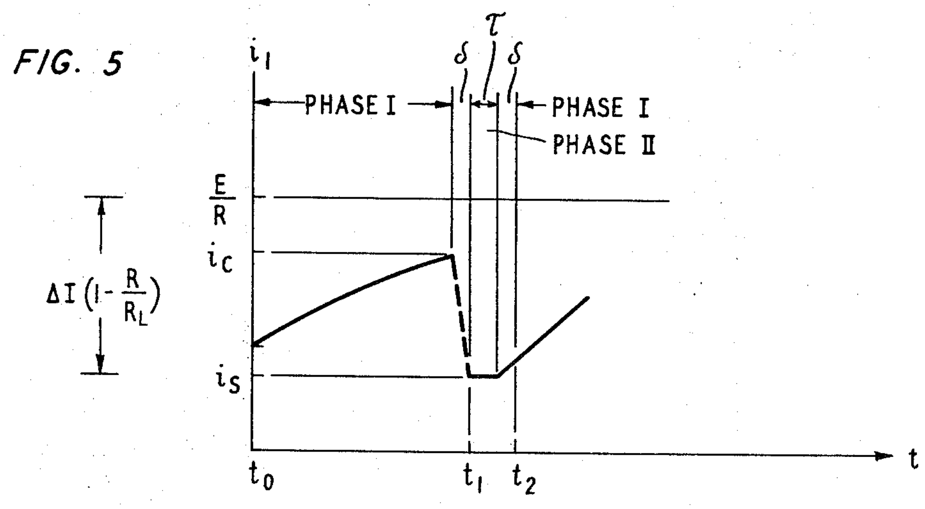
FIG. 5 is a graph of diode current versus time in the circuit of FIG. 4.

Referring to FIG. 4, the rate at which current $i_L$ through the inductor can increase during the time period designated Phase I is limited by the time constant of the circuit $L/R$, where R is defined as $$R=\frac{R_L(R_0+R_g)}{R_L+R_0+R_g} \qquad (2)$$

where $R_0$ is the resistance of the diode in the absence of an electric field domain, or quiescent diode resistance, and $R_g$ is the internal resistance of the source, which in most cases is negligible. As shown in FIG. 5, this in turn limits the rate at which current $i_1$ through the diode can reach the critical value $i_c$ required for nucleating a traveling domain. When a doman is triggered in the diode, the current through the diode falls to the value $i_s$ of FIG. 5 during the domain transit time $\tau$. As soon as the domain is formed, the voltage across the load and the inductor falls rapidly to a minimum peak as shown in FIG. 6 and then decays toward a steady value at a rate determined by the time constant $L/R_L$.

Figure 6:
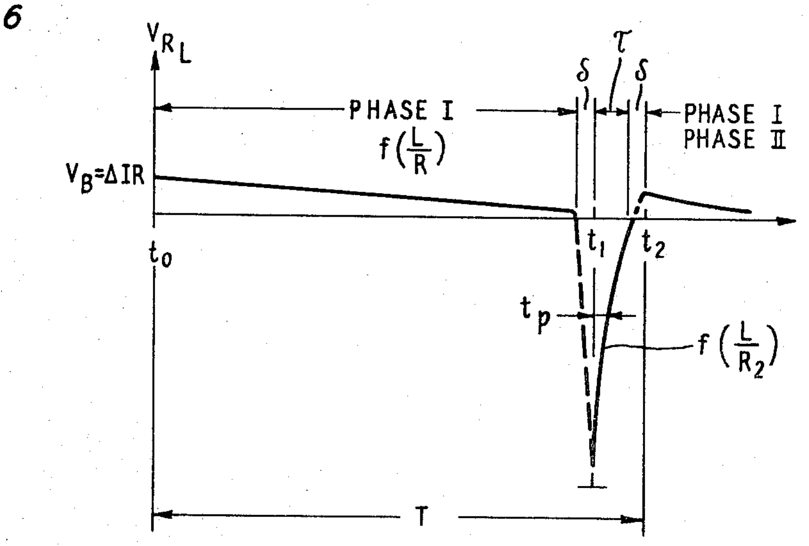
FIG. 6 is a graph of inductor voltage and load resistance voltage versus time in the circuit of FIG. 4.

FIG. 6 illustrates that the output voltage $V_{RL}$ across the load is in the form of a train of pulses of period T which is much longer than the period $\tau$ of the pulse train of prior art Gunn-effect oscillators shown in FIG. 2. As will become clear later, the time $\tau$ shown in FIG. 6 is of the same duration for a given diode as the time $\tau$ of FIG. 2, and is useful for comparison with the pulse repetition period T. Another advantage of the circuit is that the voltage amplitude of the output pulses are greater than the pulses of the circuit of FIG. 1. Finally, as will be seen more clearly later, the pulse repetition rate of the circuit can be varied by changing the bias supplied by source 18. A modulation source 16 is shown connected in phantom to the bias source to indicate that the pulsed output can be frequency modulated by modulating the bias voltage, if so desired.

While the pulse repetition rate of my circuit depends on the circuit parameters, certain generalizations can be made of the requirements for attaining the advantages described above. Referring to FIG. 6, the time constant $L/R$ should be longer than the domain transit time $\tau$ to inhibit triggering of the diode at least during the time $\tau$, or, $$L/R>\tau \qquad (3)$$

where R is defined by Equation 2. On the other hand, the time constant $L/R_L$ should not be not so long as to prevent the inductor current $i_L$ from decaying significantly during each cycle as shown in FIG. 4, or $$L/R_L<10\tau \qquad (4)$$

The voltage generated by the source 12 should be sufficient to bias the diode beyond its critical voltage $V_c$, or, $$V_{bb}>V_c \qquad (5)$$

The resistance $R_g$ is preferably small, but if it is significant with respect to the quiescent diode resistance $R_0$ relationship (5) should be expressed as $$\frac{V_{bb}}{R_0+R_g}>i_c \qquad (6)$$

where $i_c$ is the critical current for initiating oscillations in the diode and is given as $$i_c=\frac{V_c}{R_0} \qquad (7)$$

In addition, for optimum relation of the time constants shown in FIG. 4, the load resistance should conform to the relationship, $$R_L>(R_0+R_g) \qquad (8)$$

Figure 7:
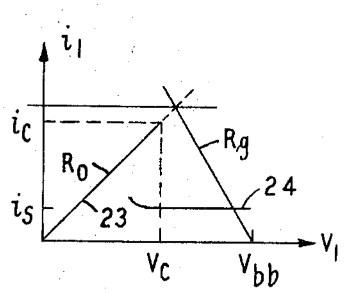
FIG. 7 is a graph of diode current versus diode voltage in the device of FIG. 4.

The foregoing is a generaized description of how the circuit of FIG. 3 operates to produce the output waveform shown in FIG. 6. The following is a more detailed analysis of the circuit from which expressions for the output voltage and input DC power will be derived. Referring to FIG. 7, which is the voltage-current characteristic of the two-valley diode 17 of FIG. 3, at voltages below the threshold or critical voltage $V_c$ for domain nucleation, the device displays a positive resistance and the current increases with applied voltage as shown by curve portion 23. The slope of curve 23 indicates the diode positive quiescent resistance $R_0$.

When the voltage exceeds $V_c$ and the current exceeds $i_c$, traveling domains are formed and, during the transit time of a domain, the current through the device is of a substantially constant value $i_s$ as shown by curve 24. The overlapping of curves 24 and 23 indicates that a traveling domain, once nucleated will persist and not be quenched even if the applied voltage is reduced slightly below the threshold voltage $V_c$. When the domain is extinguished at the positive contact, the current will rise to a value on curve 23, and if the applied voltage still exceeds $V_c$, a new domain will form and the current will immediately drop once more to a value on curve 24.

Figure 8:
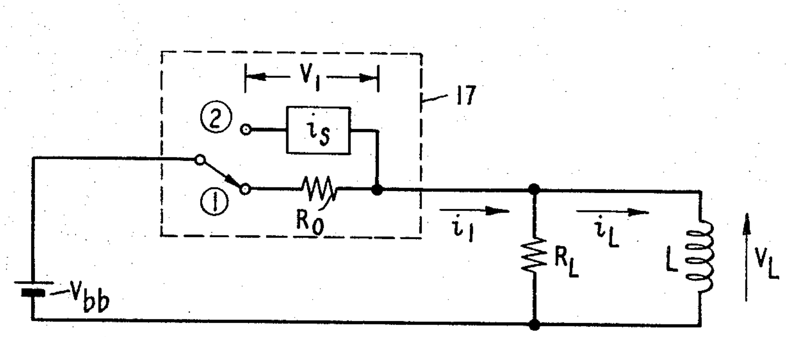
FIG. 8 is an equivalent circuit of the circuit of FIG. 4 illustrating operation by the diode in the quiescent and the active states.

Because of the two discrete characteristics 23 and 24 of FIG. 8, the diode 17 is represented in FIG. 8 as being two devices: one, a substantially linear resistance $R_0$ having characteristic 23, and the other a constant current generator $i_s$ having the constant current characteristic 24. "Phase I," represented by the switch in position 1, occurs when the diode is in the linear resistance $R_0$ region represented by curve 23 of FIG. 7, and "Phase II," with the switch in position 2, occurs when a domain is in transit in the diode. Referring to FIG. 4, "Phase I" begins at time $t_0$ and ends at time $t_1$.

Figure 9:
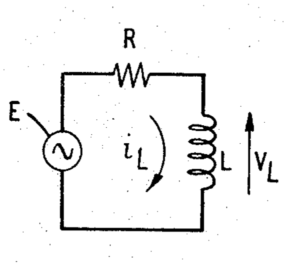
FIG. 9 is an equivalent circuit of the circuit of FIG. 8 when the diode is in its quiescent state.

Assume that at time $t_0$ the switch is in position 1 at which the diode, being in its quiescent state, is represented by the resistance $R_0$ and the characteristic 23 of FIG. 7. To clarify the transient analysis, let the resistive network to the left of inductor L of FIG. 8 be replaced by its Thevenin equivalent as shown in FIG. 9. The resistance R of FIG. 9 is the value given by Equation 2 and the voltage E is $$E=\frac{V_{bb}R_L}{R_L+R_0+R_g} \qquad (9)$$

Now letting $t_0=0$, the transient condition of FIG. 9 is given by $$i_L(t)=i_L(t_0)+\Delta I\left(1-e^{-\frac{Rt}{L}}\right) \qquad (10)$$

where E and R have been defined by Equations 2 and 9, $i_L(t_0)$ is the inductor current at time $t_0$, and $$(E/R-i_L(t_0))=\Delta I \qquad (11)$$

The inductor voltage shown in FIG. 6 is given by $$V_L=L\frac{di_L}{dt}=R\Delta Ie^{-\frac{Rt}{L}} \qquad (12)$$

The peak inductor voltage, occurring at time $t_0$, is the circuit "backswing" and is given by $$V_B=V_L(t_0)=R\Delta I \qquad (13)$$

This voltage, though necessary for circuit operation, is not considered a useful output and therefore should be kept low in value.

Returning to FIG. 9, it is seen that the diode current is $$i_1=i_L+\frac{V_L}{R_L} \qquad (14)$$

Therefore, substituting (10) and (12) into (14) gives, $$i_1(t)=\frac{E}{R}-\Delta I\left(1-\frac{R}{R_L}\right)e^{-\frac{Rt}{L}} \qquad (15)$$

This is shown in FIG. 5.

Beginning at time $t_0$, the diode current $i_1$ rises exponentially until at time $t_1-\delta$ the "critical current" $i_c$ is reached, or, $$i_1(t_1-\delta)=i_c \text{ (see FIG. 5)} \qquad (16)$$

At this point a high field domain is nucleated, and the diode quickly reverts to a constant-current condition ($i_s$) which is represented by the FIG. 8 switch in position 2. This initiates "Phase II" of the operating cycle which is defined to begin at $t_1$ and end at $t_2-\delta$. Therefore, $$i_1(t)=i_s \text{ for } t_1\leqq t\leqq t_2-\delta \qquad (17)$$

Figure 10:
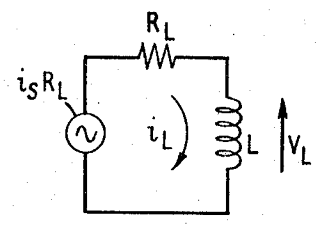
FIG. 10 is an equivalent circuit of the circuit of FIG. 8 when the diode is in its active state.

Again, to clarify the analysis, the FIG. 8 circuit with switch in position 2, is replaced by its Thevenin equivalent circuit shown in FIG. 10.

Now, letting $t_1=0$ and noting that $$i_L(t_1-\delta)=i_L(t_1)$$

it is seen from FIG. 10 that $$i_L(t)=i_L(t_1)-\Delta I'\left(1-e^{-\frac{R_Lt}{L}}\right) \qquad (18)$$

where $$\Delta I'=[i_L(t_1)-i_s]$$

The initial inductor current $i_L(t_1)$ is found from (14) and (17) to be $$i_L(t_1)=i_c-\frac{V_L(t_1-\delta)}{R_L} \qquad (19)$$

By simultaneously solving (12), (15), and (16) it is found that $$V_L(t_1-\delta)=V_{bb}-i_c(R_0+R_g) \qquad (20)$$

Hence (19) becomes $$i_L(t_1)=i_c\left(1+\frac{R_0+R_g}{R_L}\right)-\frac{V_{bb}}{R_L} \qquad (21)$$

The inductor voltage ($V_L$ of FIG. 6) during "Phase II" is given by $$V_L(t)=L\frac{di_L}{dt}=-R_L\Delta I'e^{-\frac{R_Lt}{L}} \qquad (22)$$

Since $V_L(t)$ also appears across the load $R_L$ it is the useful output voltage and at time $t_1$ it reaches a peak value given by $$V_p=V_L(t_1)=-R_L\Delta I' \qquad (23)$$

"Phase II" ends at $t_2-\delta$, and "Phase I" again begins at $t_2=t_0$ where $t_2-t_1=\tau$, the domain transit time.

The time duration of "Phase I" may be found by substituting (16) into (15) and solving for $t_1$, which gives $$t_1\approx t_1-\delta=\frac{L}{R}\ln\frac{\Delta I(1-R/R_L)}{(E/R-i_c)} \qquad (24)$$

The value of $\Delta I$ can be found from (18) and (21) by letting $i_L(i_2)=i_L(t_0)$. The oscillation period is $$T=t_1+\tau \qquad (25)$$

Note that T is a function of $V_{bb}$ thus giving voltage tunability as described before. By making the simplifying assumptions that $t_p=L/R_L=\tau$, $R_g=0$ and $i_c=2i_s$, a normalized version of Equation 16 can be written as a function of two variables $$\frac{t_1}{t_p}=\frac{1+\frac{R_0}{R_L}}{\frac{R_0}{R_L}}\ln\frac{\left(\frac{1}{1+\frac{R_0}{R_L}}\right)\left\{X-\frac{1}{2}-\left[\frac{1}{2}-\frac{R_0}{R_L}(X-1)\right]e^{-1}\right\}}{X-1} \qquad (26)$$

where $$X=\frac{V_{bb}}{R_0i_c}$$

It may be erroneously inferred from Equation 24 that $t_1$ can be made arbitrarily large by letting $E/R\approx i_c$, which in Equation 26 is the same as letting $X\approx 1$. However, it is experimentally found that when this is attempted the oscillator becomes erratic and the output pulses display considerable "jitter." Therefore, for stable operation, it seems best to let $X>1.2$, although for some $R_0/R_L$ ratios this lower limit may severely restrict the maximum value of $t_1/t_p$.

For determining power requirements, consider FIG. 3: the DC power delivered by the battery 18 is $$P_{DC}=V_{bb}I_{DC} \qquad (27)$$

where $$I_{DC}=\frac{1}{T}\int_0^T i_1dt \qquad (28)$$

During "Phase II," the DC current is $$\bar{I}_2=i_s \qquad (29)$$

Therefore $$I_{DC}=\bar{I}_1\frac{t_1}{T}+\frac{\bar{I}_2\tau}{T} \qquad (30)$$

As a specific example, consider the circuit of FIG. 3 as having the following parameters:

Critical diode current $=i_c=.133$ ampere
Quiescent diode resistance $=R_0=22.5$ ohms
Inductance $=L=7.5\times10^{-9}$ henries
Load resistance $=R_L=75$ ohms
Battery voltage $=V_{bb}=3.15$ volts
DC power consumption $=P_{DC}=0.30$ watt.

Then the output voltage will have the characteristics:

Pulse height $=V=5$ volts
Pulse width $=t_p=10^{-10}$ seconds
Pulse period $=T=10^{-9}$ seconds.

The invention as described thus far is a free-running pulse generator. If so desired, it could be modified to be used as a pulse regenerator according to the principles described in the aforementioned Uenohara patent application. If the voltage $V_{bb}$ of the battery 18 of FIG. 4 is maintained at a value below the threshold required for triggering oscillations, then an input voltage across the diode 17 will trigger a traveling domain within the diode. The traveling domain in turn will generate a pulse across the load 19 in accordance with the principles described above, and the parameters of the circuit can be adjusted to give a much higher voltage amplitude output than in a circuit of the type described in the Uenohara application. Since $V_{bb}$ is below threshold, no new domains will be triggered after the input voltage is removed. If the input voltage has a duration that is less than the period T, then only one output pulse will be generated in response to an input pulse.

It is also clear that if the DC battery voltage is above the critical value, a gate signal can be used to reduce the voltage across the diode to interrupt the pulsed output. Also, a synchronizing signal can be used to modify the frequency of the output in accordance with known phase-locking principles.

Figure 11:
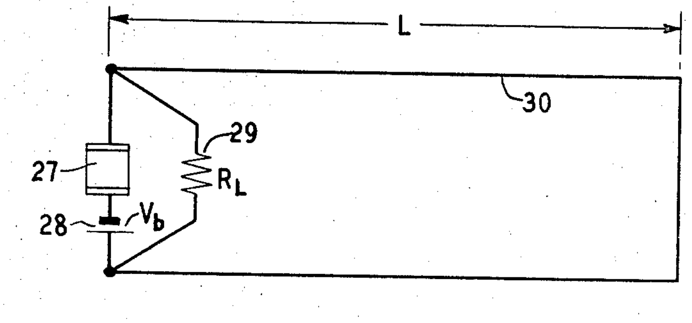
FIG. 11 is a schematic diagram of a pulse generator in accordance with another embodiment of the invention.
Figures 13, 14:
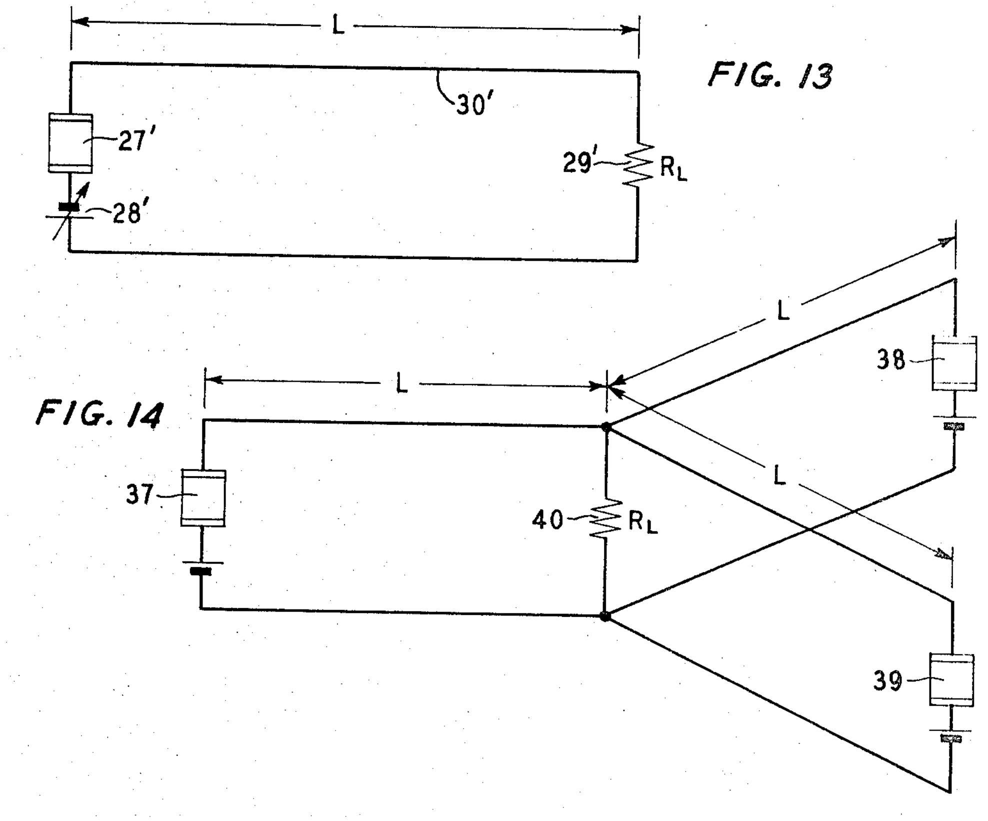
FIG. 13 is a schematic diagram of yet another embodiment of the invention.
FIG. 14 is a schematic diagram of still another embodiment of the invention.

FIGS. 11 and 13 show how generated pulses can be reflected from the end of a transmission line to reduce temporarily the bias across the diode and thereby control the pulse repetition rate. In these embodiments the transmission line is distributed and performs a function analogous to that of inductor 20 of FIG. 3 in that it stores energy and applies it to the diode to control the successive nucleation of domains.

Referring to FIG. 11, a two-valley semiconductor diode 27 is connected in series with a bias source 28 and in parallel with a load 29 having a resistance $R_L$. A transmission line 30 is connected at one end to the diode and is short-circuited at its other end. The length L of the transmission line is chosen to give an electrical propagation time T from one end of the line to the other of slightly less than one-half the domain transit time $\tau$ of the diode.

Figure 12:
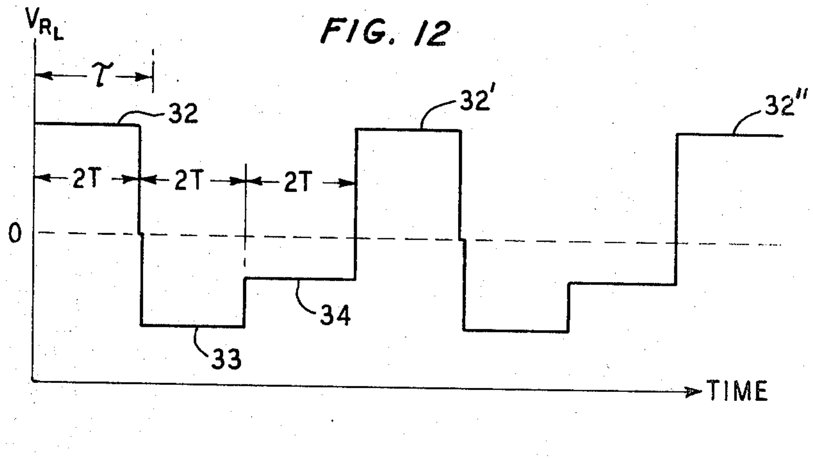
FIG. 12 is a graph of load voltage versus time in the circuit of FIG. 11.

Referring to FIG. 12, which is a graph of voltage across the load 29 with respect to time, the initial bias voltage $V_{bb}$ applied by source 28 is slightly in excess of the critical voltage required for domain formation. The immediate increase in voltage across both the load and the diode results in a voltage pulse 32 which, in the absence of the transmission line 30, would have a duration $\tau$ equal to the domain transit time. Part of the pulse, however, propagates along transmission line 30, is reflected from the short-circuited end, and after the time 2T taken to travel to the short-circuited end and back again, is reapplied to the diode. It can be shown that in the process of being reflected, the pulse is reversed in polarity and therefore reduces the voltage across the diode after it reaches the diode end of the line. The reduced diode voltage is insufficient to support the domain which is then quenched or extinguished before it completes its transit across the diode. As soon as the high field domain within the diode has become extinguished, the voltage across the load again drops, due to the reflected pulse, to give a negative-going pulse 33.

The negative-going pulse 33, however, is reflected by the load and diode combination with reversed polarity, and is again reflected by the short-circuited end of the transmission line, again with a polarity reversal. Thus, after another time period 2T, reflected pulse energy is again applied across the diode and load resistance as shown by voltage 34. The negative-going voltage pulse 34 is of smaller magnitude than voltage 33 because of reflection losses. Losses due to repeated reflection accumulate until the net diode bias exceeds the critical breakdown voltage, at which time a new domain is nucleated, and a new voltage pulse 32' is generated by the diode. The period between pulses 32 and 32' determines the frequency of the pulsed output across the load 29, and it can be seen that this frequency is reduced by the transmission line 30 in much the same manner as by the inductor of FIG. 3.

Neglecting any battery resistance $R_g$, it can be shown the amplitude $V_{32}$ of pulse 32 of FIG. 12 is given by $$V_{32}=(i_c-i_s)\frac{R_LZ_0}{R_L+Z_0} \qquad (31)$$

where $Z_0$ is the characteristic impedance of transmission line 30. The amplitude $V_{33}$ of pulse 33 is given by $$V_{33}=\frac{2(i_c-i_s)\left(\frac{R_LZ_0}{R_L+Z_0}\right)\left(\frac{R_LR_0}{R_L+R_0}\right)}{\frac{R_LR_0}{R_L+R_0}+Z_0} \qquad (32)$$

In order that energy may be reflected from the diode-load combination, the impedance of that combination as seen by the transmission line should be smaller than the transmission line characteristic impedance. If the impedance seen by the transmission line is $Z_p$, then $$Z_0>Z_p \qquad (33)$$

Neglecting battery resistance, $Z_p$ in FIG. 11 is given by $$Z_p=\frac{R_LR_0}{R_L+R_0} \qquad (34)$$

It can be seen that as $V_{bb}$ is increased, the pulsed output frequency increases because a shorter time is required for reflection losses to accumulate to such an extent that reflected pulses no longer suppress domain formation. It is preferred, however, that $V_{bb}$ be sufficiently small that the first reflected pulse quenches any domain in the diode; however, if the time 2T is nearly equal to $\tau$, this consideration is insignificant because after the period $\tau$, any domain is inherently extinguished. It is also preferred that the transmission line propagation time T be at least equal to one-fourth $\tau$ to give an appreciable reduction in output frequency by the principle described.

If so desired, the load may be located at the end of the transmission line opposite the diode as shown in FIG. 13. The impedance $R_L$ of load 29' is lower than the characteristic impedance of transmission line 30' so that, as in the FIG. 11 embodiment, pulse energy is reflected back to the diode with reversed polarity. Likewise, at the diode end, the impedance seen by the transmission line is lower than the transmission line characteristic impedance. In the circuit of FIG. 13, these conditions may be expressed as $$Z_0>R_L \qquad (35)$$

$$Z_0>Z_p=R_0 \qquad (36)$$

The mode of operation and the voltages appearing across the diode of FIG. 13 are substantially the same as those of FIG. 11.

One advantage of the FIG. 13 embodiment is that the outputs of several diodes can be combined to give high power output pulses. Referring to FIG. 14, three two-valley diodes 37, 38, and 39 are each connected by a transmission line of length L to a load 40. The resistance $R_0$ of each of the diodes is smaller than the characteristic impedance $Z_0$ of each of the transmission lines. In order that load 40 may reflect energy back to each individual diode, the load resistance $R_L$ is made lower than the transmission line characteristic impedance divided by the number *n* of transmission lines, in this case three, or, $$R_L < Z_{0/n} \qquad (37)$$

It is of course preferred that the transmission lines and the diodes be identical so that pulses from all three diodes will be delivered in synchronism to the load. Even if the transmission line lengths differ slightly, however, the circuit will exhibit reliable self-synchronization because pulses reflected from the load will be delayed until pulses from at least two of the diodes have arrived at the load. Hence, within a short transient period, pulses from all three diodes are delivered to the load simultaneously to produce a high power output across the load.

It is to be understood that the circuits described are intended to operate at microwave frequencies, and that most such microwave circuits would include parameters which, for the sake of simplicity, have not been considered. Moreover, the schematic illustrations described are intended to be merely illustrative and interconnections and arrangements other than those shown may be made. Various other modifications and embodiments may be made by those skilled in the art without departing from the spirit and scope of the invention.

What is claimed is:

1. An oscillator circuit comprising:
a two-valley semiconductor diode of the type which is capable of internally generating electric field domains that each traverse the diode in a time $\tau$ in response to an applied voltage above a prescribed threshold value;
a bias source connected to the diode;
a load having the resistance $R_L$ connected in parallel with an inductor of inductance $_L$, the load and inductor being connected to the diode and the bias source;
the load and inductor substantially conforming to the relationships:

$$L/R_L < 10\tau$$

$$L \div \frac{(R_0+R_g)R_L}{R_0+R_g+R_L} > \tau$$

$$R_L > (R_0+R_g)$$

where $R_0$ is the quiescent resistance of the diode and $R_g$ is the resistance of the bias source.

2. The oscillator circuit of claim 1 wherein:
the voltage generated by the bias source is above the threshold value for generating electric field domains in the diode.

3. The oscmillator circuit of claim 2 further comprising:
means for varying the frequency of oscillations across the load comprising means for varying the voltage of said bias source.

4. A pulse generator circuit comprising:
a two-valley semiconductor diode of the type which is capable of internally generating electric field domains that each traverse the diode in a time $\tau$ in response to an applied voltage above a prescribed threshold value;

means comprising a voltage source for biasing the diode above the prescribed value, thereby to cause generation of a first electrical pulse;
and means for controlling the generation of subsequent pulses comprising means for causing at least part of said first pulse to be fed back to the diode to reduce the total diode bias to a temporary value below the prescribed threshold value, thereby to control the frequency of generated output pulses.

5. The pulse generator of claim 4 further comprising:
means for varying the output frequency comprising means for varying the bias voltage.

6. The pulse generator of claim 4 wherein:
the frequency controlling means comprises the parallel combination of an inductor and a load connected to the diode.

7. The pulse generator of claim 4 wherein:
the frequency controlling means comprises a transmission line connected at a first end to the diode, being short-circuited at a second end, and having an electrical propagation time from the first end to the second end that is smaller than one-half $\tau$.

8. The pulse generator of claim 7 further comprising:
a load connected to the first end of the transmission line in parallel with the diode;
the impedance terminating the first end of the diode being smaller than the characteristic impedance of the transmission line, whereby transmission line energy incident at the first end is reflected.

9. The pulse generator of claim 4 wherein:
the frequency control means comprises a transmission line connected at a first end to the diode, having a second end terminated by the load, and having an electrical propagation time from one end to the other that is smaller than one-half $\tau$;
the impedance terminating the second end of the transmission line being smaller than the characteristic impedance of the transmission line, whereby transmission line energy is reflected with a reversed polarity.

10. The pulse generator of claim 9 wherein:
the impedance terminating the first end of the transmission line is smaller than the transmission line characteristic impedance.

11. The pulse generator of claim 10 further comprising:
a second transmission line connected at a first end to a second diode and at a second end to the load;
said diodes and transmission lines being substantially identical.

12. The pulse generator of claim 11 further comprising:
a plurality of second transmission lines each having a second diode connected to a first end thereof and being connected at a second end to the load;
said transmission lines and diodes being substantially identical;
the characteristic impedance of each transmission line divided by the number of transmission lines being larger than the impedance of the load.

References Cited

UNITED STATES PATENTS 3,365,583 1/1968 Gunn -------------- 331—107

JOHN KOMINSKI, Primary Examiner

U.S. Cl. X.R.

331—132